United States Patent
Nakahara et al.

(10) Patent No.: US 8,338,716 B2
(45) Date of Patent: Dec. 25, 2012

(54) CIRCUIT BOARD AND METHOD OF MANUFACTURING THE SAME

(75) Inventors: Youichiro Nakahara, Tsu (JP); Naoto Ikegawa, Hirakata (JP); Kyohei Uemura, Tsu (JP); Yoshiyuki Uchinono, Hirakata (JP)

(73) Assignee: Panasonic Corporation, Osaka (JP)

( * ) Notice: Subject to any disclaimer, the term of this patent is extended or adjusted under 35 U.S.C. 154(b) by 354 days.

(21) Appl. No.: 12/741,105

(22) PCT Filed: Nov. 4, 2008

(86) PCT No.: PCT/JP2008/070030
§ 371 (c)(1),
(2), (4) Date: May 3, 2010

(87) PCT Pub. No.: WO2009/060821
PCT Pub. Date: May 14, 2009

(65) Prior Publication Data
US 2010/0263921 A1    Oct. 21, 2010

(30) Foreign Application Priority Data
Nov. 5, 2007    (JP) .................................. 2007-287604

(51) Int. Cl.
*H05K 1/09*    (2006.01)
(52) U.S. Cl. ..................................................... 174/257
(58) Field of Classification Search .......... 174/255–266; 361/792–795
See application file for complete search history.

(56) References Cited

U.S. PATENT DOCUMENTS

| 3,162,512 | A | 12/1964 | Robinson |
| 5,104,480 | A | 4/1992 | Wojnarowski et al. |
| 5,367,195 | A | 11/1994 | DiGiacomo et al. |
| 5,420,073 | A | 5/1995 | DiGiacomo et al. |
| 5,494,781 | A | 2/1996 | Ohtani et al. |

(Continued)

FOREIGN PATENT DOCUMENTS

EP    0607732    7/1994

(Continued)

OTHER PUBLICATIONS

Official Action in counterpart Korean Application No. 10-2010-7009340, dated Jun. 7, 2011 (with English-language abstract).

(Continued)

*Primary Examiner* — Jeremy Norris
(74) *Attorney, Agent, or Firm* — Greenblum & Bernstein, P.L.C.

(57) ABSTRACT

A circuit board includes: an insulating substrate; and a circuit formed on the insulating substrate. The circuit includes: a undercoat layer with a circuit pattern formed by irradiating a metal thin film covering a surface of the insulating substrate with a laser along an outer shape of the circuit so as to partly remove the metal thin film along the outer shape of the circuit; a Cu plating layer, a Ni plating layer and a Au plating layer formed by metal plating and sequentially provided on a surface of the undercoat layer. A first middle plating layer and a second middle plating layer are provided between the Ni plating layer and the Au plating layer. The first middle plating layer includes metal with a less noble standard electrode potential with respect to Au and is in contact with the Au plating layer. The second middle plating layer includes metal with a noble standard electrode potential with respect to the metal in the first middle plating layer and is in contact with the first middle plating layer.

13 Claims, 7 Drawing Sheets

U.S. PATENT DOCUMENTS

| | | |
|---|---|---|
| 5,650,088 A | 7/1997 | Kodama |
| 6,127,052 A | 10/2000 | Tomari et al. |
| 6,534,192 B1 | 3/2003 | Abys et al. |
| 6,869,665 B2 * | 3/2005 | Tani et al. .................... 428/209 |
| 2006/0243780 A1 | 11/2006 | Lee et al. |

FOREIGN PATENT DOCUMENTS

| | | |
|---|---|---|
| FR | 2893813 | 5/2007 |
| JP | 03-250639 | 11/1991 |
| JP | 04-280494 | 10/1992 |
| JP | 06-260759 | 9/1994 |
| JP | 07-66533 | 3/1995 |
| JP | 08-260192 | 10/1996 |
| JP | 08-260194 | 10/1996 |
| JP | 10-168577 | 6/1998 |
| JP | 11-330652 | 11/1999 |
| JP | 2000-282033 | 10/2000 |
| JP | 2001-068828 | 3/2001 |
| JP | 2001-144393 | 5/2001 |
| JP | 2001-279491 | 10/2001 |
| JP | 2006-344686 | 12/2006 |

OTHER PUBLICATIONS

Official Action in counterpart Chinese Application No. 200880114840.3, dated Jun. 16, 2011 (with English-language abstract).

International Search Report for PCT/JP2008/070030, mailed Feb. 17, 2009.

Search report from E.P.O. that issued with respect to patent family member European Patent Application No. 08847958.9, mail date is Sep. 28, 2011.

* cited by examiner

PRIOR ART

PRIOR ART

CIRCUIT BOARD AND METHOD OF MANUFACTURING THE SAME

TECHNICAL FIELD

The present invention relates to a circuit board in which a circuit is formed on a surface of an insulating substrate formed into a flat-plate shape or a three-dimensional shape, and relates to a method of manufacturing the circuit board.

BACKGROUND ART

As a circuit board formed by providing a circuit on a surface of an insulating substrate, a technique for forming the circuit by patterning by use of a laser is disclosed (for instance, refer to Patent Citation 1).

In a method of manufacturing the circuit board by such a technique, an insulating substrate 1 is prepared by molding first as shown in FIG. 1(a), then a metal thin film 2 is formed on the entire surface of the insulating substrate 1 by sputtering and the like as shown in FIG. 1(b). Next, a no-circuit forming portion B as an insulating portion for a circuit 3 to be provided on the surface of the insulating substrate 1 is irradiated with a laser L along an outer shape of the circuit 3, thereby removing the metal thin film 2 on the portion irradiated with the laser L as shown in FIG. 1(c). Due to such a removal of the metal thin film 2 by laser irradiation along the outer shape of the circuit 3, it is possible to form a undercoat layer 4 by the metal thin film 2 remained on a circuit forming portion A having the same pattern as the circuit 3. The undercoat layer 4 is isolated from the metal thin film 2 remained on the no-circuit forming portion B. Then, by performing electrolytic copper plating while applying current to the undercoat layer 4, a Cu plating layer 5 is formed on a surface of the undercoat layer 4 as shown in FIG. 1(d). In this point, current is not applied to the metal thin film 2 remained on the no-circuit forming portion B. Thus, the surface of the metal thin film 2 on the no-circuit forming portion B is not subjected to Cu plating. The metal thin film 2 on the no-circuit forming portion B is subsequently removed by soft etching, thereby forming the circuit 3 composed of the Cu plating layer 5 plated on the undercoat layer 4 as shown in FIG. 1(e).

With regard to the circuit 3 formed by the Cu plating layer 5 as described above, while copper and alloy thereof have high electric conductivity, reactive oxide and sulfide may be generated due to corrosion even in normal circumstances, whereby conductivity of electric wirings may be highly detracted. Thus, when the circuit board is used for especially household electronic appliances such as a mobile phone and a mobile digital still camera, a Ni plating layer 6 and a Au plating layer 7 are to be provided on the surface of the Cu plating layer 5 as shown in FIG. 1(f). The Ni plating layer 6 with high adhesion to both Cu and Au is provided between the Cu plating layer 5 and the Au plating layer 7 as a middle layer, in order to protect the Cu plating layer 5 by providing the Au plating layer 7 composed of Au and having good corrosion resistance and contact reliability on the uppermost surface, and prevent Cu and Au from being diffused due to heat load such as a reflow.

Patent Citation 1: Japanese Patent No. 3153682

DISCLOSURE OF INVENTION

Technical Problem

However, Ni is tend to easily react with many ions present in nature such as chlorine ion and sulfide ion in the air. Especially, with regard to devises operated by a person such as a mobile phone and a mobile digital still camera, a corrosion reaction of Ni is easily promoted in the Ni plating layer 6 and corrosion products are easily generated by reacting with chlorine ion and sulfide ion and the like contained in perspiration from a human body.

Figure 2:
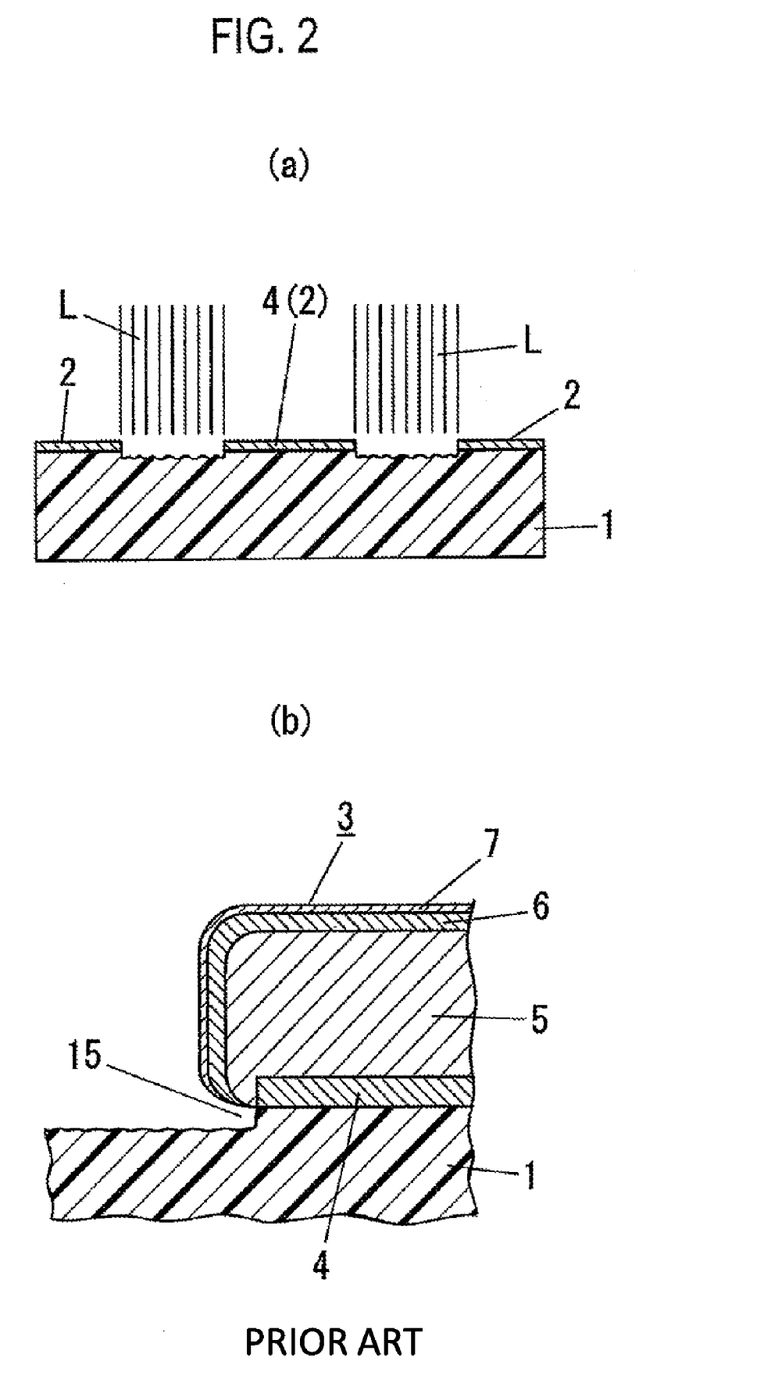
FIG. 2 shows a conventional example.

As described above, the undercoat layer 4 with the same pattern as the circuit 3 is formed by irradiating with the laser L along the outer shape of the circuit 3 to remove the metal thin film 2 on the no-circuit forming portion B. In this case, the laser L also acts on a surface of the insulating substrate 1 after removing the metal thin film 2. Therefore, the surface of the insulating substrate 1 may be roughed around the undercoat layer 4 appearing to be dug as shown in FIG. 2(a) due to the laser L acting on the insulating substrate 1. In the formation of the circuit 3 by plating to stack the Cu plating layer 5, the Ni plating layer 6 and the Au plating layer 7 on the undercoat layer 4 as shown in FIG. 2(b), a small gap 15 is caused between the Cu plating layer 5 or the Ni plating layer 6 and the surface of the insulating substrate 1 at a lower portion of a side edge of the circuit 3 when the surface of the insulating substrate 1 is roughed around the undercoat layer 4. In the gap 15, the Cu plating layer 5 and the Ni plating layer 6 are usually not covered with the Au plating layer 7. As a result, there was a problem of corrosion possibility of the Cu plating layer 5 and the Ni plating layer 6 occurred from the gap portion.

The present invention has been made focusing on the above-described problems. An object of the present invention is to provide a circuit board including a circuit with good corrosion resistance and the method of manufacturing the circuit board.

Solution to Problem

One aspect of the present invention provides a circuit board including: an insulating substrate; and a circuit formed on the insulating substrate. The circuit includes: a undercoat layer with a circuit pattern formed by irradiating a metal thin film covering a surface of the insulating substrate with a laser along an outer shape of the circuit so as to partly remove the metal thin film along the outer shape of the circuit; a Cu plating layer, a Ni plating layer and a Au plating layer formed by metal plating and sequentially provided on a surface of the undercoat layer; and a first middle plating layer and a second middle plating layer provided between the Ni plating layer and the Au plating layer. The first middle plating layer includes metal with a less noble standard electrode potential with respect to Au and is in contact with the Au plating layer. The second middle plating layer includes metal with a noble standard electrode potential with respect to the metal in the first middle plating layer and is in contact with the first middle plating layer.

Another aspect of the present invention provides a circuit board including: an insulating substrate; and a circuit formed on the insulating substrate. The circuit includes: a undercoat layer with a circuit pattern formed by irradiating a metal thin film covering a surface of the insulating substrate with a laser along an outer shape of the circuit so as to partly remove the metal thin film along the outer shape of the circuit; and a Cu plating layer, a Ni plating layer and a Au plating layer formed by metal plating and sequentially provided on a surface of the undercoat layer. The insulating substrate is formed by molding a resin composition composed of polyphthalamide. A surface roughness Rz of the insulating substrate of a portion in which the metal thin film is removed by irradiating with the laser along the outer shape of the circuit is less than 1.9 times rougher than the surface roughness Rz of the insulating substrate before irradiating with the laser.

Another aspect of the present invention provides a method of manufacturing the circuit board according to one aspect of the present invention including: forming an undercoat layer with a circuit pattern by irradiating a metal thin film covering a surface of an insulating substrate with a laser along an outer shape of a circuit so as to remove the metal thin film along the outer shape of the circuit; and sequentially providing a Cu plating layer, a Ni plating layer, a second middle plating layer, a first middle plating layer and a Au plating layer on a surface of the undercoat layer by metal plating so as to form the circuit. The first middle plating layer is formed by use of metal with a less noble standard electrode potential with respect to Au, and is in contact with the Au plating layer. The second middle plating layer is formed by use of metal with a noble standard electrode potential with respect to the metal in the first middle plating layer, and is in contact with the first middle plating layer.

Another aspect of the present invention provides a method of manufacturing the circuit board according to another aspect of the present invention including: forming a undercoat layer with a circuit pattern by irradiating a metal thin film covering a surface of an insulating substrate with a laser along an outer shape of a circuit so as to remove the metal thin film along the outer shape of the circuit; and sequentially providing a Cu plating layer, a Ni plating layer and a Au plating layer on a surface of the undercoat layer by metal plating so as to form the circuit. The irradiation with the laser is performed by controlling an irradiation condition so that a surface roughness Rz of the insulating substrate of a portion in which the metal thin film is removed by irradiating with the laser is less than 1.9 times rougher than the surface roughness Rz of the insulating substrate before irradiating with the laser.

ADVANTAGEOUS EFFECTS OF INVENTION

According to the present invention, the first middle plating layer 8 including metal with a less noble standard electrode potential with respect to Au is provided in contact with the Au plating layer, and the second middle plating layer 9 including metal with a noble standard electrode potential with respect to the metal in the first middle plating layer 8 is provided in contact with the first middle plating layer 8, respectively, between the Ni plating layer 6 and the Au plating layer 7. Thus, a potential barrier blocking the electrons from moving is provided between the second middle plating layer 8 at the side of the Ni plating layer 6 and the first middle plating layer 9 at the side of the Au plating layer 7. Therefore, the electrons are protected from shifting to the Au plating layer 7 and being emitted due to the reduction reaction even if the electrons are generated by the corrosion reaction of Ni in the Ni plating layer 6. Accordingly, it is possible to inhibit Ni from being corroded in the Ni plating layer 6 and prevent corrosion from being caused in the circuit 3.

Moreover, according to the present invention, surface roughness Rz of the insulating substrate 1 of the portion in which the metal thin film 2 is removed by irradiating with the laser L along the outer shape of the circuit 3 is configured to be less than 1.9 times rougher than a surface roughness Rz of the insulating substrate 1 before irradiating with the laser L. Thus, the surface roughness of the insulating substrate 1 in which the metal thin film 2 surrounding the undercoat layer 4 is removed is lessened. Therefore, it is possible to prevent a gap from being provided between the Cu plating layer 5 or the Ni plating layer 6 formed on the undercoat layer 4 and the surface of the insulating substrate 1. As a result, corrosion of the Cu plating layer 5 and the Ni plating layer 6 caused by such a gap can be prevented. Accordingly, the circuit board including the circuit 3 with high durability can be obtained.

BRIEF DESCRIPTION OF DRAWINGS

FIGS. 1(a) to 1(e) are cross-sectional views, and FIG. 1(f) is a partial enlarged cross-sectional view.

FIGS. 2(a) and 2(b) are partial enlarged cross-sectional views.

FIGS. 3(a) to 3(e) are schematic cross-sectional views, and FIG. 3(f) is a partial enlarged cross-sectional view.

FIG. 4(a) is a view with regard to Example 2, and FIG. 4(b) is a view with regard to Comparative Example 4.

FIGS. 7(a) and 7(b) are plan views, respectively.

BEST MODE FOR CARRYING OUT THE INVENTION

A description will be made below of a best mode for carrying out the present invention.

FIGS. 3(a) to 3(f) show schematic cross-sectional views of a manufacturing process for a circuit board in an embodiment of the present invention respectively. The circuit board in the embodiment of the present invention shown in FIG. 3(f) includes an insulating substrate 1, and a circuit 3 formed on the insulating substrate 1. The circuit 3 includes a undercoat layer 4 provided with a circuit pattern by irradiating a metal thin film covering a surface of the insulating substrate with a laser along an outer shape of the circuit so as to partly remove the metal thin film along the outer shape of the circuit. The circuit 3 further includes a Cu plating layer 5, a Ni plating layer 6 and a Au plating layer 7 sequentially formed on the undercoat layer 4 by metal plating. In addition, between the Ni plating layer 6 and the Au plating layer 7, a first middle plating layer 8 including metal with a less noble standard electrode potential with respect to Au is formed in contact with the Au plating layer 7. Moreover, a second middle plating layer 9 including metal with a noble standard electrode potential with respect to the metal in the first middle plating layer 8 is formed in contact with the first middle plating layer 8.

Figure 1:
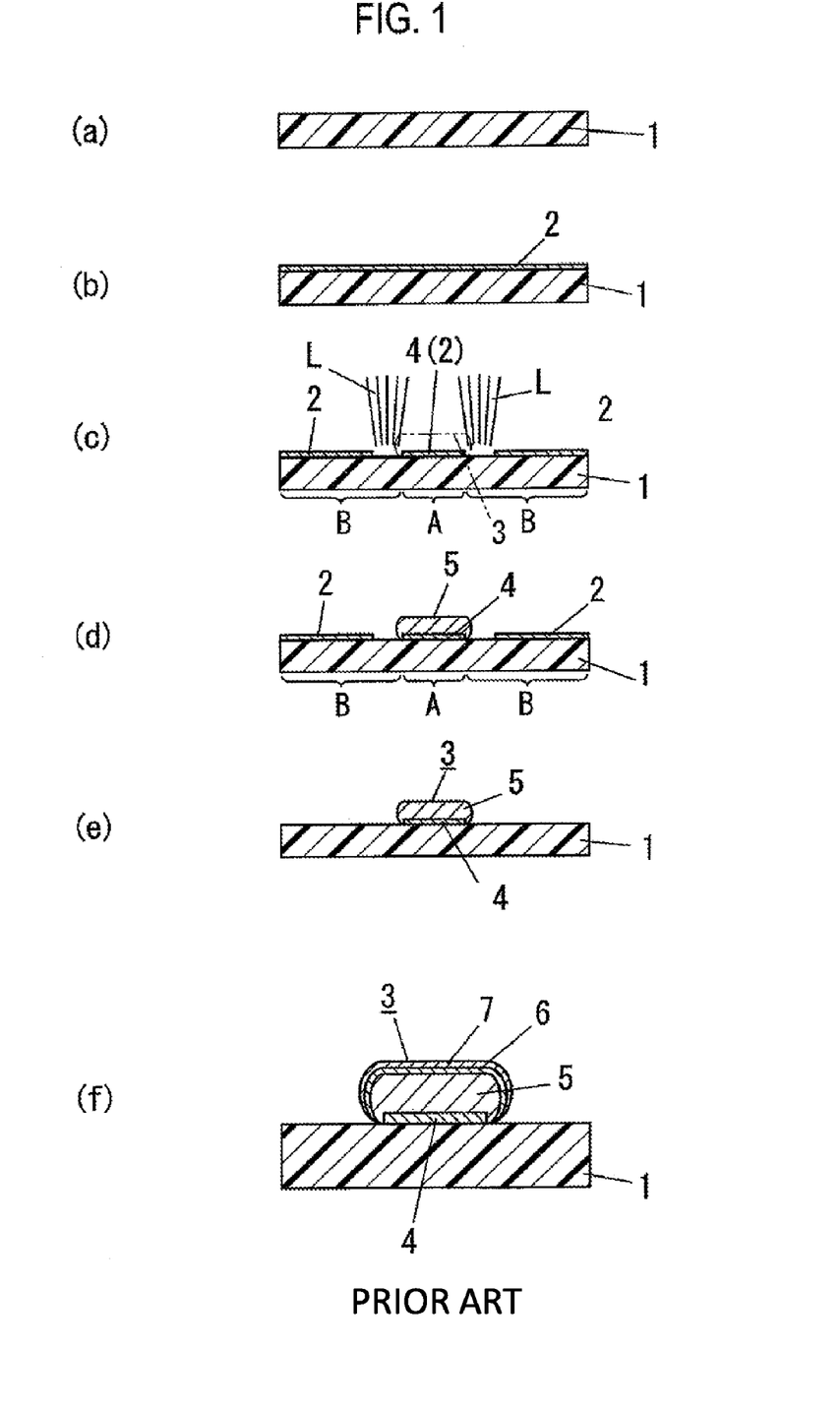
FIG. 1 shows a conventional example.

In a conventional circuit board shown in FIG. 1, a corrosion reaction of Ni in the Ni plating layer 6 is promoted by emitting electrons simultaneously with ionization of Ni in the circuit 3 formed by stacking the Cu plating layer 5, the Ni plating layer 6 and the Au plating layer 7. The electrons shift to the metal with a more noble standard electrode potential than Ni, i.e. the Au plating layer 7, and are emitted from the uppermost Au plating layer 7 by a reduction reaction, in which the corrosion reaction of Ni is easily promoted. Especially when the Au plating layer 7 is provided with pinholes, chlorine ion, sulfide ion and the like act on the Ni plating layer 6 through the pinholes and the above-mentioned corrosion reaction of Ni is easily promoted. As a result, corrosion resistance of the circuit 3 is significantly lowered.

According to the circuit board in the embodiment of the present invention, the first middle plating layer 8 and the second middle plating layer 9 are provided at the side of the Au plating layer 7 and at the side of the Ni plating layer 6, respectively, between the Ni plating layer 6 and the Au plating layer 7. Thus, a potential barrier blocking the electrons from shifting is provided between the second middle plating layer 8 at the side of the Ni plating layer 6 and the first middle plating layer 9 at the side of the Au plating layer 7. Therefore, the electrons are protected from shifting to the Au plating layer 7 and being emitted due to the reduction reaction even if the electrons are generated by the corrosion reaction of Ni in the Ni plating layer 6. Accordingly, it is possible to inhibit Ni from being corroded in the Ni plating layer 6 and prevent corrosion from being caused in the circuit 3.

As for the insulating substrate 1 according to the present invention, a molding product of a thermoplastic resin and a thermosetting resin such as polyphthalamide, liquid crystal polymer, ABS, polyimide and polyetherimide, and molded ceramics such as alumina can be employed. In addition, a substrate formed into a three-dimensional shape can also be employed, other than the substrate formed into a flat-plate shape as shown in FIG. 3(a).

When the insulating substrate 1 is manufactured by molding a resin composition, the resin composition can be prepared by adding inorganic filler into a base resin as necessary, followed by mixing and kneading. When the base resin is a crystalline thermoplastic resin, fine powder filler in powder form, fibrous form, plate form, spherical form and the like may be appropriately added as a crystalline nucleus for a promotion of crystallization. Moreover, a small amount of additives such as a plasticizer, an antistatic agent, a stabilizer, a coloring agent such as a pigment, a lubricant, and a flame retardant may be added. Then, the resin composition is formed in pellet form by extruding and molding the resin composition, followed by injecting and molding by use of a mold, for instance. Thus, the insulating substrate 1 can be obtained.

As for the base resin in the resin composition, various kinds of a thermoplastic resin and a thermosetting resin can be employed as described above. Especially, polyphthalamide is preferably used. Polyphthalamide is a kind of aromatic polyamide, which is essentially excellent in adhesion to a metal layer. Polyphthalamide is also excellent in heat resistance, mechanical characteristics, dimensional stability and drug resistance. In addition, Polyphthalamide has good melting fluidity, less molding contamination, and good moldability. Therefore, it is possible to obtain the insulating substrate 1 having high physical characteristics and drug resistance.

Before forming the metal thin film 2 on the insulating substrate 1 to be prepared as described above, the surface of the insulating substrate 1 is subjected to plasma treatment so as to activate the surface of the insulating substrate 1. Plasma treatment can be performed by using a plasma treatment device in which a pair of electrodes faces each other in a chamber, one electrode is connected to a high-frequency power source, and another electrode is connected to ground. When the surface of the insulating substrate 1 is subjected to plasma treatment, the insulating substrate 1 is provided on one electrode between the electrodes, and pressure is reduced so as to become approximately $10^{-4}$ Pa by a vacuuming in the chamber, followed by introducing and passing gas active in chemical reaction such as $N_2$ and $O_2$ into the chamber. Then, gas pressure in the chamber is controlled so as to become 8 to 15 Pa, followed by applying high-frequency voltage (RF: 13.56 MHz) between the electrodes for approximately 10 to 100 seconds by the high-frequency power source. Then, active gas in the chamber is excited by a gas discharge phenomenon due to a high-frequency glow discharge between the electrodes, and plasma of cation, radical and the like is generated, so as to be provided in the chamber. Such cation and radical hit the surface of the insulating substrate 1, whereby the surface of the insulating substrate 1 can be activated, and adhesion of the metal thin film 2 formed on the surface of the insulating substrate 1 can be enhanced. Especially, when cation hits the insulating substrate 1, a nitrogen polar group and an oxygen polar group easily bonded to metal are introduced into the surface of the insulating substrate 1, so that adhesion to the metal thin film 2 is further improved. Note that, plasma treatment is not limited to the above-described condition. Plasma treatment may be arbitrary set and performed under a condition within a range not to excessively roughen the surface of the insulating substrate 1 due to plasma treatment.

After plasma treatment as described above, the metal thin film 2 is formed on the entire surface of the insulating substrate 1 as shown in FIG. 3(b). The metal thin film 2 can be formed by Physical Vapor Deposition (PVD) selected from sputtering, vacuum deposition and ion plating. After the insulating substrate 1 is subjected to plasma treatment in the chamber as described above, sputtering, vacuum deposition or ion plating is preferably performed consecutively as a sequential process without opening the chamber to the atmosphere. As for the metal to prepare the metal thin film 2, pure metal such as copper, nickel, gold, aluminum, titanium, molybdenum, chromium, tungsten, tin, lead, brass and NiCr, or alloy thereof can be used.

As for the above-mentioned sputtering, DC sputtering can be adopted, for instance. First, the insulating substrate 1 is provided in the chamber. Then, pressure in the chamber is reduced by a vacuuming with a vacuum pump so as to become $10^{-4}$ Pa or less, followed by introducing inactive gas such as argon into the chamber so as to become gas pressure of 0.1 Pa. Moreover, a copper target is bombarded by applying a DC voltage of 500 V, whereby the surface of the insulating substrate 1 can be provided with the metal thin film 2 such as a copper film with a film thickness of approximately 300 to 500 nm.

As for the above-mentioned vacuum deposition, an electron beam-heating vacuum deposition can be adopted. First, pressure in the chamber is reduced by a vacuuming with a vacuum pump so as to become $10^{-3}$ Pa or less, followed by generating an electron flow of 400 to 800 mA. Then, the electron flow hits a depositing material in a crucible and is heated so as to evaporate the depositing material, whereby the surface of the insulating substrate 1 can be provided with the metal thin film 2 such as a copper film with a film thickness of approximately 300 nm.

With regard to the formation of the metal thin film 2 by ion plating, pressure in the chamber is reduced by a vacuuming so as to become $10^{-4}$ Pa or less, followed by evaporating the depositing material under the similar condition to the above-described vacuum deposition. In addition, inactive gas such as argon is introduced into an inductive antenna located between the insulating substrate 1 and the crucible, and plasma is generated in the state where gas pressure is 0.05 to 0.1 Pa. Then, the inductive antenna is applied with 500 W of power at high frequency of 13.56 MHz, and applied with a bias voltage of a DC voltage of 100 to 500 V, whereby the surface of the insulating substrate 1 can be provided with the metal thin film 2 such as a copper film with a film thickness of approximately 300 to 500 nm.

In the formation of the metal thin film 2 on the insulating substrate 1 by PVD as described above, the surface of the insulating substrate 1 is chemically activated by plasma treatment, so as to improve adhesion of the metal thin film 2 to the surface of the insulating substrate 1. The metal thin film 2 may have a thickness enough to be applied with current when electroplating. Thus, the thickness of the metal thin film 2 may be extremely thin as described above.

Next, the undercoat layer 4 is prepared from the metal thin film 2 after the formation of the metal thin film 2 on the surface of the insulating substrate 1 as described above. The undercoat layer 4 can be formed by laser patterning. As shown in FIG. 3(c), a laser L is irradiated along the outer shape of the circuit 3 formed on the insulating substrate 1 and along a border of a circuit forming portion A composing the circuit 3 and a no-circuit forming portion B being an insulating portion of the circuit 3, so as to remove the metal thin film 2 on the no-circuit forming portion B. Thus, the metal thin film 2 on the circuit forming portion A is remained as a circuit pattern, thereby forming the undercoat layer 4.

Then, the undercoat layer 4 is applied with current to be electroplated. The undercoat layer 4 is electroplated by electrolytic copper plating, thereby forming the Cu plating layer 5 on the surface of the undercoat layer 4 as shown in FIG. 3(d). In this case, the metal thin film 2 remained on the no-circuit forming portion B is not applied with current since the metal thin film 2 is isolated from the undercoat layer 4. Therefore, the surface of the metal thin film 2 remained on the no-circuit forming portion B is not subjected to Cu plating. A thickness of the Cu plating layer 5 formed on the surface of the undercoat layer 4 is preferably, but not limited to, approximately 0.5 μm to 50 μm, more preferably approximately 1 μm to 35 μm.

The metal thin film 2 on the no-circuit forming portion B is subsequently removed by soft etching treatment, while the Cu plating layer 5 on the circuit forming portion A is remained. Thus, the circuit 3 with a pattern configuration can be prepared by being composed of the Cu plating layer 5 plated on the undercoat layer 4 as shown in FIG. 3(e).

In order to improve corrosion resistance and contact reliability of the circuit 3 after the formation of the circuit 3 by forming the Cu plating layer 5 on the undercoat layer 4 as described above, the Cu plating layer 5 is further provided with the Ni plating layer 6 and the Au plating layer 7 thereon by electrolytic nickel plating and electrolytic gold plating to finish the circuit 3. With regard to a thickness of the Ni plating layer 6 and the Au plating layer 7, the Ni plating layer 6 preferably has, but not limited to, approximately 0.5 μm to 30 μm thickness, more preferably approximately 3 μm to 20 μm thickness, and the Au plating layer 7 preferably has, but not limited to, approximately 0.001 μm to 5 μm thickness, more preferably approximately 0.005 μm to 2 μm thickness.

According to the present invention, when the Ni plating layer 6 and the Au plating layer 7 are provided on the Cu plating layer 5 as described above, the first middle plating layer 8 and the second middle plating layer 9 are provided by electroplating, respectively, between the Ni plating layer 6 formed in contact with the Cu plating layer 5 and the Au plating layer 7 formed on the uppermost surface. The first middle plating layer 8 is configured to have metal with a less noble standard electrode potential with respect to Au, and formed in contact with the Au plating layer 7. The second middle plating layer 9 is configured to have metal with a noble standard electrode potential with respect to the metal in the first middle plating layer 8, and formed in contact with the Ni plating layer 6 and the first middle plating layer 8, respectively.

The following Table 1 shows each standard electrode potential of major metals.

TABLE 1

| | Metal | Standard Electrode Potential (V) (Based on Reduction of Hydrogen Ion) |
|---|---|---|
| Noble ↑ ↓ Less Noble | $Au/Au^{3+}$ | +1.520 |
| | $Pt/Pt^{2+}$ | +1.188 |
| | $Ir/Ir^{3+}$ | +1.156 |
| | $Pd/Pd^{2+}$ | +0.915 |
| | $Ag/Ag^+$ | +0.799 |
| | $Rh/Rh^{3+}$ | +0.758 |
| | $Cu/Cu^{2+}$ | +0.340 |
| | $Ni/Ni^{2+}$ | −0.257 |

As shown above, the metal composing the first middle plating layer 8 has the less noble standard electrode potential with respect to Au (i.e. lower standard electrode potential than Au), and the metal composing the second middle plating layer 9 has the noble standard electrode potential with respect to the metal in the first middle plating layer 8 (i.e. higher standard electrode potential than the metal of the first middle plating layer 8). Therefore, the metal meeting such a condition is selected from Table 1 so as to form the first middle plating layer 8 and the second middle plating layer 9. Note that, the metals composing the first middle plating layer 8 and the second middle plating layer 9 may be pure metal or metal alloy. In addition, when the first middle plating layer 8 and the second middle plating layer 9 are composed of a plurality of metals such as alloy, at least one of the metals may meet the above-described condition. For instance, when the first middle plating layer 8 is composed of Rh, the second middle plating layer 9 can be composed of Pd or Ag. Moreover, metal with a lower standard electrode potential than the metal of the first middle plating layer 8 such as Pd—Ni can be used as the second middle plating layer 9. With regard to the thickness of the first middle plating layer 8 and the second middle plating layer 9, the first middle plating layer 8 preferably has, but not limited to, approximately 0.005 μm to 1 μm thickness, and the second middle plating layer 9 preferably has, but not limited to, approximately 0.005 μm to 1 μm.

FIG. 4(a) is a view conceptually showing each standard electrode potential (E (V)) of the plating layers formed in order of the Ni plating layer 6, the second middle plating layer 9, the first middle plating layer 8 and the Au plating layer 7. As described above, Ni in the Ni plating layer 6 is easily corroded by reacting with chlorine ion, sulfide ion and the like. An electron (e") emitted simultaneously with ionization of Ni shifts to more noble metal with less energy necessary to be emitted to the external by the reaction when Ni in the Ni plating layer 6 is corroded:

$$Ni \rightarrow Ni^+ + e^-$$

However, the second middle plating layer 9 with noble metal and the first middle plating layer 8 with less noble metal are provided in contact with each other, thereby forming the potential barrier blocking the electrons from moving at a border of the second middle plating layer 9 and the first middle plating layer 8. Therefore, it is possible to prevent the electron from shifting to the Au plating layer 7 and from being emitted from the outermost Au plating layer 7 by the reduction reaction. Accordingly, it is possible to prevent Ni from being corroded in the Ni plating layer 6. Moreover, even if the Au plating layer 7 is provided with pinholes, dissolution of Ni can be prevented because of the inhibition of electron emission due to the above-described potential barrier, thereby preventing the Ni plating layer 6 from being corroded.

As for the metals composing the first middle plating layer 8 and the second middle plating layer 9, an arbitrary combination can be employed as long as the metals meet the above-described condition. Specifically, the first middle plating layer 8 is preferably composed of Rh, and the second middle plating layer 9 is preferably composed of Pd—Ni. Alternatively, the first middle plating layer 8 is preferably composed of Rh, and the second middle plating layer 9 is preferably composed of Pd.

Although Rh has a lower standard electrode potential than Pt and Pd, Rh has small electric resistance and also characteristics resistant to forming an oxide film. Furthermore, when compared with a material having low electric resistance such as Ag, Rh is a stable material having high corrosion resistance in a corrosion environment. Therefore, Rh is the appropriate metal for the first middle plating layer 8.

Meanwhile, Pd and Pd alloy can provide covering with fewer pinholes than Au under an equal film-thickness condition. In addition, Pd and Pd alloy can prevent cracks from being caused due to a lower hardness than Ir and Pt. Thus, Pd and Pd alloy are suitable for forming the second middle plating layer 9 as a more noble metal than Rh in the first middle plating layer 8 and Ni in the Ni plating layer 6 to be a base layer thereof.

Due to the first middle plating layer 8 and the second middle plating layer 9 provided between the Au plating layer 7 and the Ni plating layer 6 with the combination of Rh for the first middle plating layer 8 and Pd—Ni for the second middle plating layer 9, or the combination of Rh for the first middle plating layer 8 and Pd for the second middle plating layer 9, it is possible to obtain a better effect of corrosion prevention by providing the first middle plating layer 8 and the second middle plating layer 9 between the Ni plating layer 6 and the Au plating layer 7, and possible to form the circuit 3 with high corrosion resistance. The thickness of the first middle plating layer 8 composed of Rh is preferably approximately 0.005 µm to 1 µm, more preferably approximately 0.01 µm to 0.4 µm. The thickness of the second middle plating layer 9 composed of Pd is preferably approximately 0.005 µm to 1 µm, more preferably approximately 0.01 µm to 0.5 µm. Moreover, the thickness of the second middle plating layer 9 composed of Pd—Ni is preferably approximately 0.01 µm to 1 µm, more preferably approximately 0.03 µm to 0.5 µm. An alloy ratio of Pd—Ni is preferably within a range of Pd:Ni=7:3 to 9:1 by mass.

When the Au plating layer 7 is formed by electrolytic gold plating as described above, electrolytic gold plating is preferably performed by pulse plating using a pulse wave current. Pulse plating can be provided on fine crystals with high pulse current density, so as to form the Au plating layer 7 densely and prevent pinholes from being caused. Accordingly, it is possible to effectively prevent corrosion of the circuit 3 caused by pinholes from being occurred.

In addition, the surface of the Au plating layer 7 is preferably subjected to sealing treatment after the Au plating layer 7 is provided on the outermost surface of the circuit 3. Due to such sealing treatment, pinholes can be sealed even if the pinholes are provided on the Au plating layer 7. This prevents an external environment from directly acting on the Ni plating layer 6, thereby effectively preventing the circuit 3 from being corroded by the pinholes.

Figure 5:
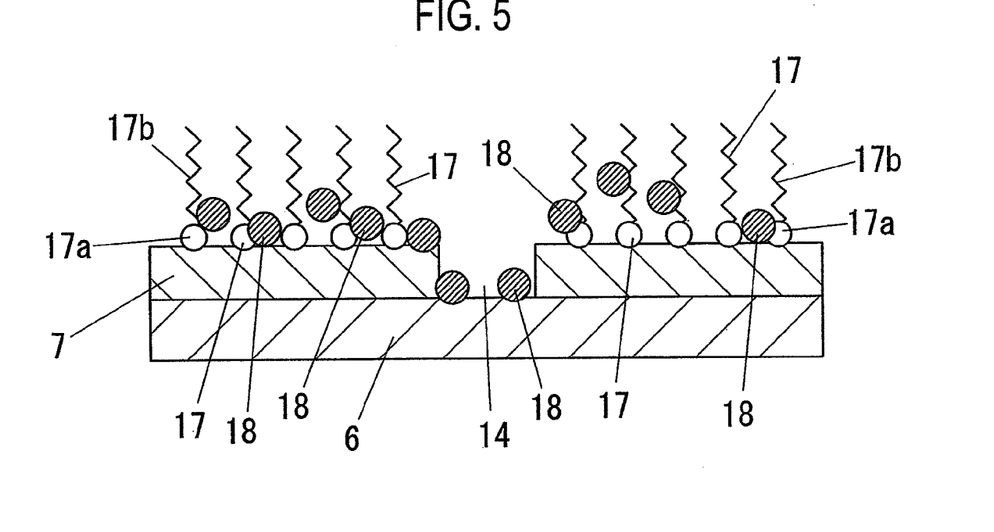
FIG. 5 shows another embodiment of the present invention, and is an enlarged schematic view under a condition after sealing treatment.

With regard to a sealing agent for sealing treatment, a conventionally provided general agent can be used. For instance, a sealing liquid containing aminotetrazole and methylbenzotriazole (refer to Japanese Patent Unexamined Publication No. 2001-279491), a water-soluble sealing liquid containing a tetrazole-based compound and a thiazole-based compound (refer to Japanese Patent Unexamined Publication No. 2000-282033), and a water-soluble sealing liquid containing one or more of a benzotriazole-based compound, a mercaptobenzothiazole-based compound and triazine-based compound (refer to Japanese Patent Nos. 2804452 and 2804453) can be included. The sealing agent contains surfactant agents 17 including hydrophilic groups 17a and lipophilic groups 17b and rust inhibitors 18. As shown in FIG. 5, the rust inhibitors 18 are uniformly adsorbed on the metal surface by the action of the surfactant agents 17 to seal a pinhole 14 even if the pinhole 14 is formed on the Au plating layer 7. Thus, it is possible to prevent the Ni plating layer 6 from being corroded in contact with a corrosion promoting component.

The following is a description of the circuit board of another embodiment of the present invention. In this circuit board, the insulating substrate 1 is formed by molding a resin composition composed of polyphthalamide. The surface roughness Rz of the insulating substrate 1 of the portion in which the metal thin film is removed by irradiating with the laser along the outer shape of the circuit 3 is configured to be less than 1.9 times rougher than the surface roughness Rz of the insulating substrate 1 before irradiating with the laser. Thus, when the undercoat layer 4 is formed by irradiating the metal thin film 2 with the laser L along the outer shape of the circuit 3, the surface roughness of the insulating substrate 1 in which the metal thin film 2 surrounding the undercoat layer 4 is removed is lessened. Therefore, it is possible to prevent a gap from being provided between the Cu plating layer 5 or the Ni plating layer 6 formed on the undercoat layer 4 and the surface of the insulating substrate 1. Accordingly, corrosion of the Cu plating layer 5 and the Ni plating layer 6 caused by such a gap can be prevented.

In the manufacturing process of the circuit board in the prior art, the metal thin film 2 covering the surface of the insulating substrate 1 is irradiated with the laser L along the outer shape of the circuit 3 to remove the metal thin film 2 on the no-circuit forming portion B, thereby forming the undercoat layer 4 with the same pattern as the circuit 3. Meanwhile, the surface of the insulating substrate 1 may be damaged and roughed as shown in FIG. 2(a) since the laser L acts on the insulating substrate 1 concurrently. During the preparation of the circuit 3 on the undercoat layer 4, the small gap 15 is caused between the Cu plating layer 5 or the Ni plating layer 6 and the surface of the insulating substrate 1 at the lower portion of the side edge of the circuit 3 as shown in FIG. 2(b) described above. As a result, corrosion may be caused from the gap 15.

In the present invention, the surface roughness Rz of the insulating substrate 1 of the portion in which the metal thin film 2 is removed by irradiating with the laser L is configured to be less than 1.9 times rougher than the surface roughness Rz of the insulating substrate 1 before irradiating with the laser L (i.e. the surface roughness Rz of the insulating substrate 1 without being irradiated with the laser L). Therefore, when irradiating with the laser L in the manufacturing process of the circuit, the laser L is to be irradiated by controlling an irradiation condition. Namely, when the surface roughness of the insulating substrate 1 before irradiating with the laser L is defined as Rz1 and the surface roughness of the insulating substrate 1 after removing the metal thin film 2 is defined as Rz2, the surface roughness is configured to be Rz2/Rz1<1.9. Note that, the surface roughness Rz is standardized according to Japan industrial standard, JIS B0601 (2001).

Figure 6:
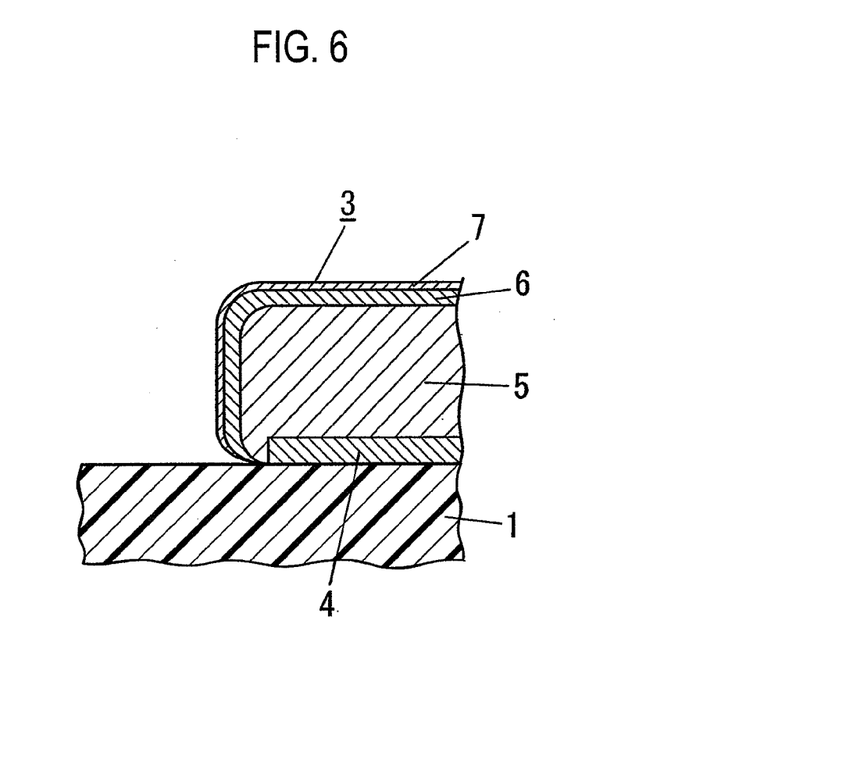
FIG. 6 is a partial enlarged cross-sectional view showing another embodiment of the present invention.

As described above, when the surface roughness Rz of the insulating substrate 1 of the portion in which the metal thin film 2 is removed by irradiating with the laser L is configured to be less than 1.9 times rougher than the surface roughness Rz of the insulating substrate 1 before irradiating with the laser L, the surface roughness of the insulating substrate 1 surrounding the undercoat layer 4 provided by being irradiated with the laser is lessened. Thus, when the circuit 3 is formed by plating on the undercoat layer 4, it is possible to prevent the gap from being caused between the Cu plating layer 5 or the Ni plating layer 6 and the surface of the insulating substrate 1 at the lower portion of the side edge of the circuit 3 as shown in FIG. 6. Therefore, the problem that the Cu plating layer 5 and the Ni plating layer 6 are corroded from the gap 15 as in the case of FIG. 2 described above, in which the gap 15 is provided at the lower portion of the side edge of the circuit 3, can be preliminarily prevented.

When the surface roughness Rz of the insulating substrate 1 of the portion in which the metal thin film 2 is removed by irradiating with the laser L is configured to be less than 1.9 times rougher than the surface roughness Rz of the insulating substrate 1 before irradiating with the laser L, it is possible to avoid the formation of the gap at the lower portion of the side edge of the circuit 3, and prevent the circuit 3 from being corroded. In addition, by providing the first middle plating layer 8 and the second middle plating layer 9 between the Au plating layer 7 and the Ni plating layer 6 as described above, it is possible to effectively prevent corrosion of the circuit 3 from being caused from the side edge thereof due to the action of the first middle plating layer 8 and the second middle plating layer 9. Furthermore, due to sealing treatment as described above, it is possible to seal the gap at the lower portion of the side edge of the circuit 3, thereby preventing the circuit 3 from being corroded more effectively.

With regard to an adjustment for the irradiation condition that the surface roughness Rz of the insulating substrate 1 of the portion in which the metal thin film 2 is removed by irradiating with the laser L is configured to be less than 1.9 times rougher than the surface roughness Rz of the insulating substrate 1 before irradiating with the laser L, specifically, a laser output condition at laser irradiation is preferably adjusted. In this case, the laser output is preferably adjusted by a relationship between a substrate color of the insulating substrate 1 composed of polyphthalamide and a wavelength of the laser L.

Figure 7:
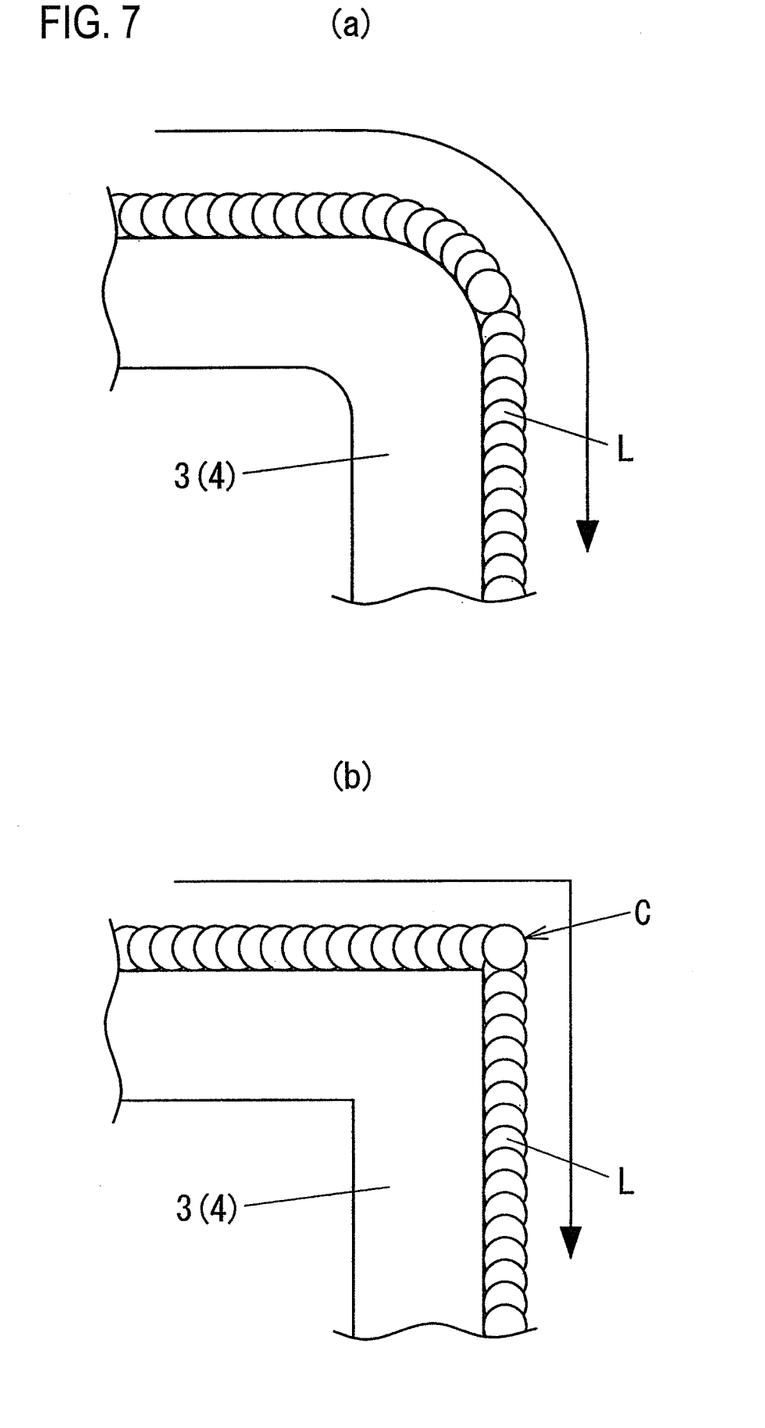
FIG. 7 shows another embodiment of the present invention.

Moreover, when the laser L is irradiated along the outer shape of the circuit 3 to remove the metal thin film 2 on the no-circuit forming portion B so as to form the undercoat layer 4 with the same pattern as the circuit 3, the laser L is preferably irradiated along the outer shape of the circuit 3 at an even energy density. Therefore, the laser L is inhibited from being irradiated at a high energy density in a certain portion along the outer shape of the circuit 3 such as a corner, thereby preventing the surface of the insulating substrate 1 from being roughed by laser irradiation. For instance, when the circuit 3 is formed to have a curved pattern, and provided with an angular corner as shown in FIG. 7(*b*), a scanning speed of the laser L is reduced at the angular corner of the circuit 3 when the laser L scans along the outer shape of the circuit 3. As a result, the energy density of the laser L irradiated at the corner (indicated by an arrow) is increased (spots of the laser L are illustrated by "○" in FIG. 6). Thus, the insulating substrate 1 is heavily damaged at the corner of the circuit 3 where the energy density of the laser L is increased, which causes the surface roughness of the insulating substrate 1 to be increased. On the other hand, by forming the circuit 3 provided with a corner having an arch-shaped pattern as shown in FIG. 7(*a*), the scanning speed of the laser L is kept constant even at the corner, so that the laser L can be irradiated along the outer shape of the circuit at the even energy density. Accordingly, it is possible to irradiate with the laser without damaging the insulating substrate 1 and increasing the surface roughness.

Figure 8:
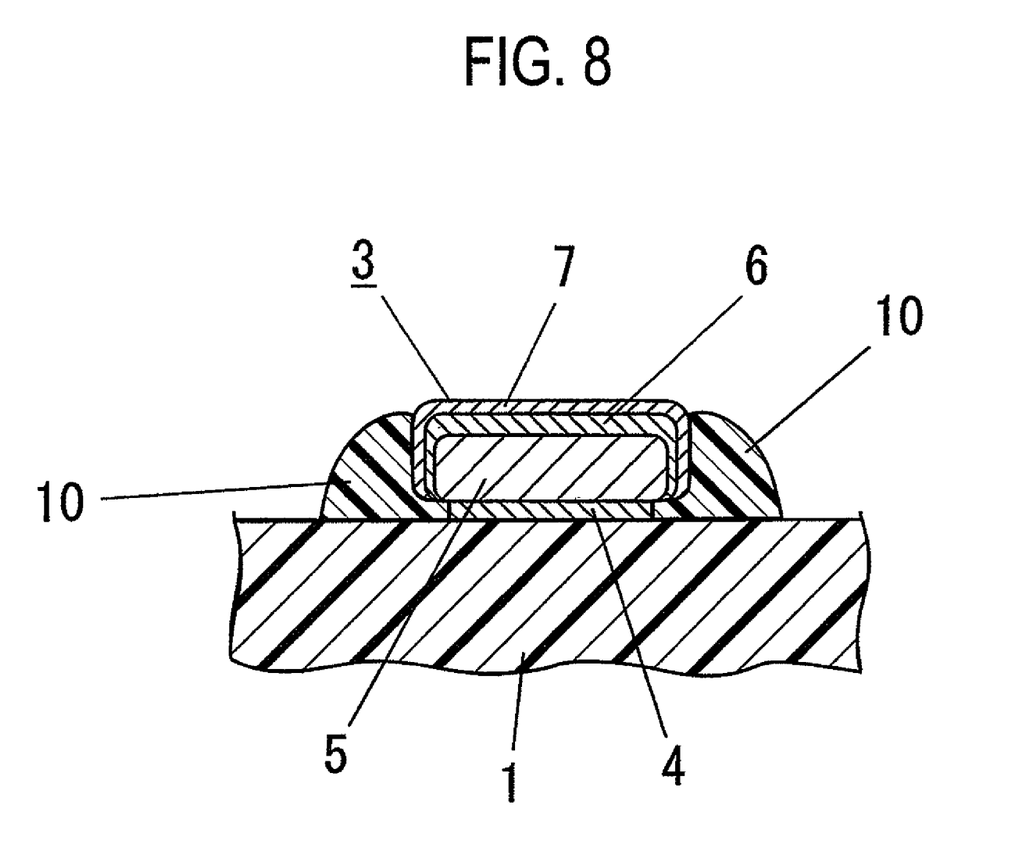
FIG. 8 is an enlarged cross-sectional view showing another embodiment of the present invention.

The embodiment in FIG. 8 is provided with a resin layer 10 between the side edge of the circuit 3 and the surface of the insulating substrate 1, so as to cover an interface of the side of the circuit 3 and the surface of the insulating substrate 1 with the resin layer 10. Thus, it is possible to seal a gap with the resin layer 10 by covering with the resin layer 10 even if the gap is provided at the lower portion of the side edge of the circuit 3. Therefore, it is possible to prevent the Cu plating layer 5 and the Ni plating layer 6 from being corroded from the gap, and prevent corrosion of the circuit 3 from being caused from the side edge thereof more effectively. In addition, by providing the first middle plating layer 8 and the second middle plating layer 9 between the Au plating layer 7 and the Ni plating layer 6 as described above, it is possible to prevent corrosion of the circuit 3 from being caused from the side edge thereof even more effectively due to the action of the first middle plating layer 8 and the second middle plating layer 9.

A resin composing the resin layer 10 is not limited to a specific resin, and an arbitrary resin such as an ultraviolet cure resin, a developable resin and a thermosetting resin can be used. For instance, an ultraviolet curable solder resist ink ("UVR-150G NTO" manufactured by Taiyo Ink Mfg. Co., Ltd.) can be included.

EXAMPLE

Hereinafter, a description will be specifically made of the present invention based on examples.

Example 1

Figure 3:
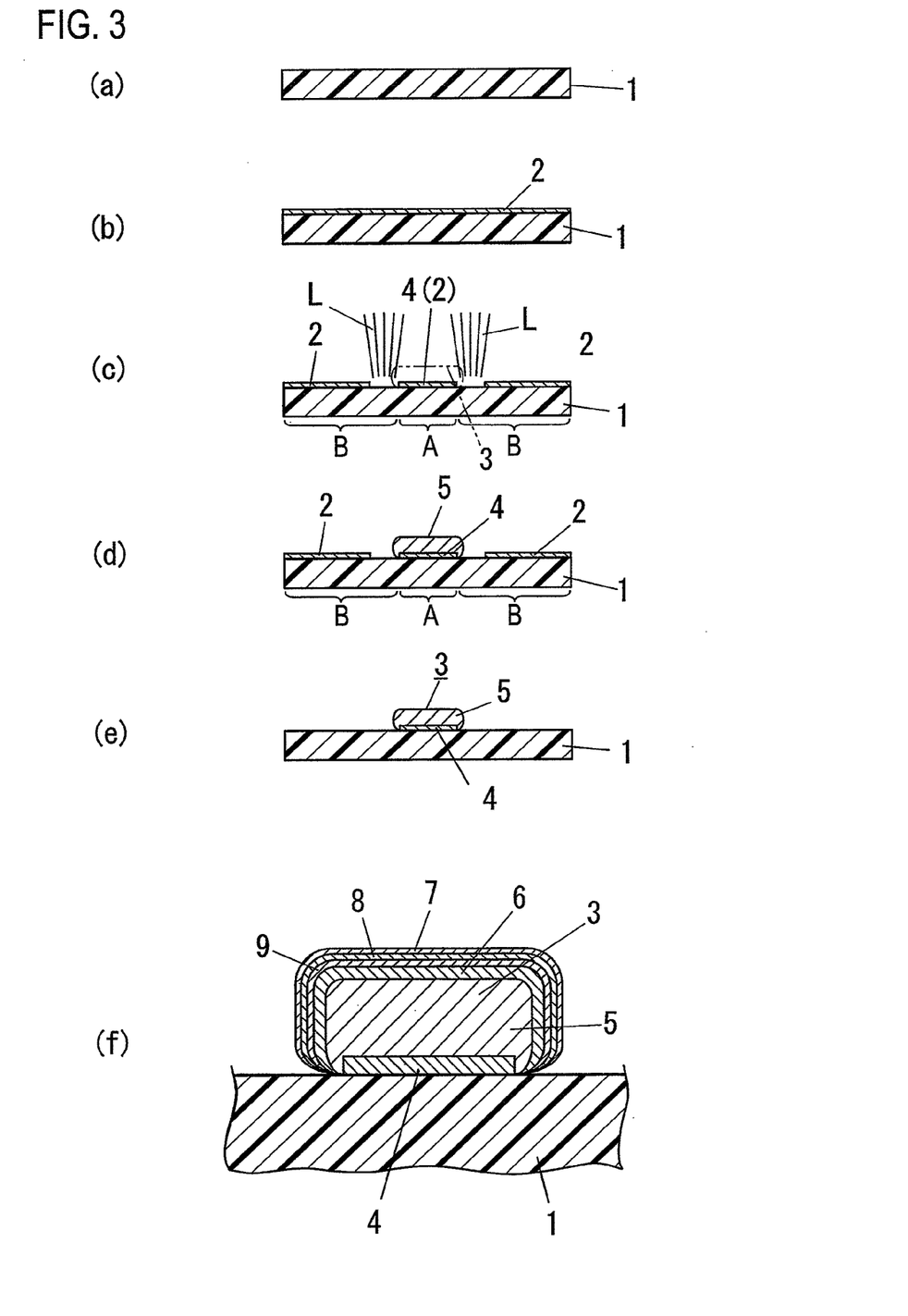
FIG. 3 shows one example of an embodiment of the present invention.

The insulating substrate 1 was molded by use of a molding material "BT150" manufactured by Kuraray Co., Ltd., in which black-colored polyphthalamide was used as a base resin (FIG. 3(*a*)). Then, a surface of the insulating substrate 1 was subjected to plasma treatment, followed by forming the metal thin film 2 with a film thickness of 0.3 μm by copper sputtering on the surface of the insulating substrate 1 (FIG. 3(*b*)).

Next, the metal thin film 2 was subjected to laser patterning to irradiate with a THG-YAG laser L with a wavelength of 355 nm and an output of 0.35 W along an outer shape of a circuit pattern, thereby forming the undercoat layer 4 (FIG. 3(*c*)).

Next, the undercoat layer 4 formed by laser patterning was subjected to copper plating to apply current to the undercoat layer 4, thereby by forming the Cu plating layer 5 on the undercoat layer 4 (FIG. 3(*d*)). In copper plating, a copper sulfate bath containing a bath composition with a copper sulfate pentahydrate having a concentration of 200 g/L, a sulfate having a concentration of 50 g/L and a chlorine ion having a concentration of 75 mg/L was used under a plating condition with a temperature of 25° C., a current density of 2.0 A/dm$^2$ and a time of 25 minutes, thereby forming the Cu plating layer 5 with a film thickness of 10 μm.

Next, an ammonium peroxide solution was used as an etching solution. The metal thin film 2 on the no-circuit forming portion B was removed by being subjected to soft etching (FIG. 3(*e*)).

Then, current was applied to the undercoat layer 4 and the Cu plating layer 5 so as to be electroplated. The circuit 3 was manufactured by stacking the Ni plating layer 6, the second middle plating layer 9, the first middle plating layer 8 and the Au plating layer 7 sequentially on the Cu plating layer, thereby obtaining a circuit board (FIG. 3(f)).

In nickel plating to form the Ni plating layer 6, a Watt's bath containing a bath composition with nickel sulfate of 300 g/L, nickel chloride of 45 g/L and boric acid of 30 g/L was used under a plating condition with a temperature of 50° C., a current density of 1.5 A/dm$^2$ and a time of 20 minutes, thereby forming the Ni plating layer 6 with a film thickness of 6 μm.

The second middle plating layer 9 was formed by Pd—Ni plating. In Pd—Ni plating, a Pd—Ni plating bath containing a bath composition with a Pd concentration of 20 g/L, a Ni concentration of 8 g/L and a pH of 7.5 was used under a plating condition with a temperature of 45° C., a current density of 5 A/dm$^2$ and a time of 20 seconds, thereby forming the second middle plating layer 9 with a Pd—Ni alloy ratio of 8:2 and a film thickness of 0.4 μm.

The first middle plating layer 8 was formed by Rh plating. In Rh plating, a rhodium sulfate bath containing a bath composition with Rh of 2.0 g/L and a sulfate concentration of 45 g/L was used under a plating condition with a temperature of 45° C., a current density of 2 A/dm$^2$ and a time of 45 seconds, thereby forming the first middle plating layer 8 with a Rh film thickness of 0.1 μm.

In gold plating to form the Au plating layer 7, a pure Au plating bath containing a bath composition with a Au concentration of 5 g/L and a Tl concentration of 10 mg/L was used under a plating condition with a temperature of 60° C., a current density of 0.2 A/dm$^2$ and a time of 90 seconds, thereby forming the Au plating layer 7 with a film thickness of 0.2 μm. Alternatively, the above-described gold plating may be replaced with pulse plating under a condition with a temperature of 60° C., a current density of 0.2 A/dm$^2$, a duty ratio ($t_{on}/(t_{on}+t_{off})$) of 0.09, on time ($t_{on}$) of 10 ms, off time ($t_{off}$) of 100 ms and a time of 30 minutes, thereby forming the Au plating layer 7 with a film thickness of 0.2 μm.

Example 2

Similar operations to those of Example 1 were repeated except that the second middle plating layer 9 was formed by Pd plating and the first middle plating layer 8 was formed by Rh plating, thereby obtaining the circuit board.

In Pd plating for the second middle plating layer 9, a Pd plating bath containing a bath composition with a Pd concentration of 6 g/L and a pH of 0.8 was used under a plating condition with a temperature of 55° C., a current density of 0.75 A/dm$^2$ and a time of 25 seconds, thereby forming the second middle plating layer 9 with a Pd film thickness of 0.1 μm.

The first middle plating layer 8 composed of Rh was formed under the same condition as Example 1.

Example 3

Similar operations to those of Example 1 were repeated except that the second middle plating layer 9 was formed by Ag plating and the first middle plating layer 8 was formed by Rh plating, thereby obtaining the circuit board.

In Ag plating for the second middle plating layer 9, a low cyanide bath containing a bath composition with a Ag concentration of 50 g/L, a free cyanide concentration of 1 g/L and a Se concentration of 5 mL/L was used under a plating condition with a temperature of 50° C., a current density of 2 A/dm$^2$ and a time of 15 seconds, thereby forming the second middle plating layer 9 with a Ag film thickness of 0.3 μm.

The first middle plating layer 8 composed of Rh was formed under the same condition as Example 1.

Comparative Example 1

Similar operations to those of Example 1 were repeated except that the second middle plating layer 9 and the first middle plating layer 8 were not formed, thereby obtaining the circuit board.

Comparative Example 2

Similar operations to those of Example 1 were repeated except that only one middle plating layer composed of Pd—Ni was provided between the Ni plating layer 6 and the Au plating layer 7, thereby obtaining the circuit board. Pd—Ni plating was performed under the same condition as Example 1.

Comparative Example 3

Similar operations to those of Example 1 were repeated except that only one middle plating layer composed of Rh was provided between the Ni plating layer 6 and the Au plating layer 7, thereby obtaining the circuit board. Rh plating was performed under the same condition as Example 1.

Comparative Example 4

Similar operations to those of Example 1 were repeated except that the second middle plating layer 9 was formed by Rh plating and the first middle plating layer 8 was formed by Pd plating, thereby obtaining the circuit board. Rh plating was performed under the same condition as Example 1, and Pd plating was performed under the same condition as Example 2.

Comparative Example 5

Similar operations to those of Example 1 were repeated except that the second middle plating layer 9 was formed by Rh plating and the first middle plating layer 8 was formed by Pd—Ni plating, thereby obtaining the circuit board. Rh plating and Pd—Ni plating were performed under the same condition as Example 1.

The circuit boards obtained in the above-described Examples 1 to 3 and Comparative Examples 1 to 5 were subjected to a galvanic corrosion test by use of artificial perspiration. As for artificial perspiration, acidic perspiration and alkaline perspiration shown in Table 2 compliant with JIS L0848 (2004) were used. The circuit boards were immersed in such artificial perspiration, followed by applying DC current with 1.2 V to the circuits 3 for three hours.

TABLE 2

|  | Acidic Perspiration | Alkaline Perspiration |
|---|---|---|
| L-Histidine hydrochloride monohydrate | 0.5 g/L | 0.5 g/L |
| Sodium Chloride | 5 g/L | 5 g/L |
| Sodium Dihydrogen Phosphate Dihydrate | 2.2 g/L | — |
| Disodium Phosphate Dodecahydrate | — | 5 g/L |
| 0.1 mol Sodium Hydroxide | 15 mL/L | 25 mL/L |
| pH | 5.5 | 8.0 |

Then, the circuits 3 were subjected to a visual observation to evaluate the circuits 3 with rust as "x" (bad), and without rust as "○" (good). The results are shown in Table 3.

TABLE 3

|  | Example | | | Comparative Example | | | | |
| --- | --- | --- | --- | --- | --- | --- | --- | --- |
|  | 1 | 2 | 3 | 1 | 2 | 3 | 4 | 5 |
| Au Plating Layer | Au | Au | Au | Au | Au | Au | Au | Au |
| First Middle Plating Layer | Rh | Rh | Rh | — | Pd—Ni | Pd—Ni | Pd | Pd—Ni |
| Second Middle Plating Layer | Pd—Ni | Pd | Ag | — |  |  | Rh | Rh |
| Ni Plating Layer | Ni | Ni | Ni | Ni | Ni | Ni | Ni | Ni |
| Cu Plating Layer | Cu | Cu | Cu | Cu | Cu | Cu | Cu | Cu |
| Corrosion Resistance | ○ | ○ | ○ | X | X | X | X | X |

As shown in Table 3, rust is not caused in Examples 1 to 3, in which the first middle plating layer 8 including metal with a less noble standard electrode potential with respect to Au and the second middle plating layer 9 including metal with a noble standard electrode potential with respect to the metal in the first middle plating layer 8 are provided. It is recognized that durability of the circuit 3 can be enhanced by providing the first middle plating layer 8 and the second middle plating layer 9.

Figure 4:
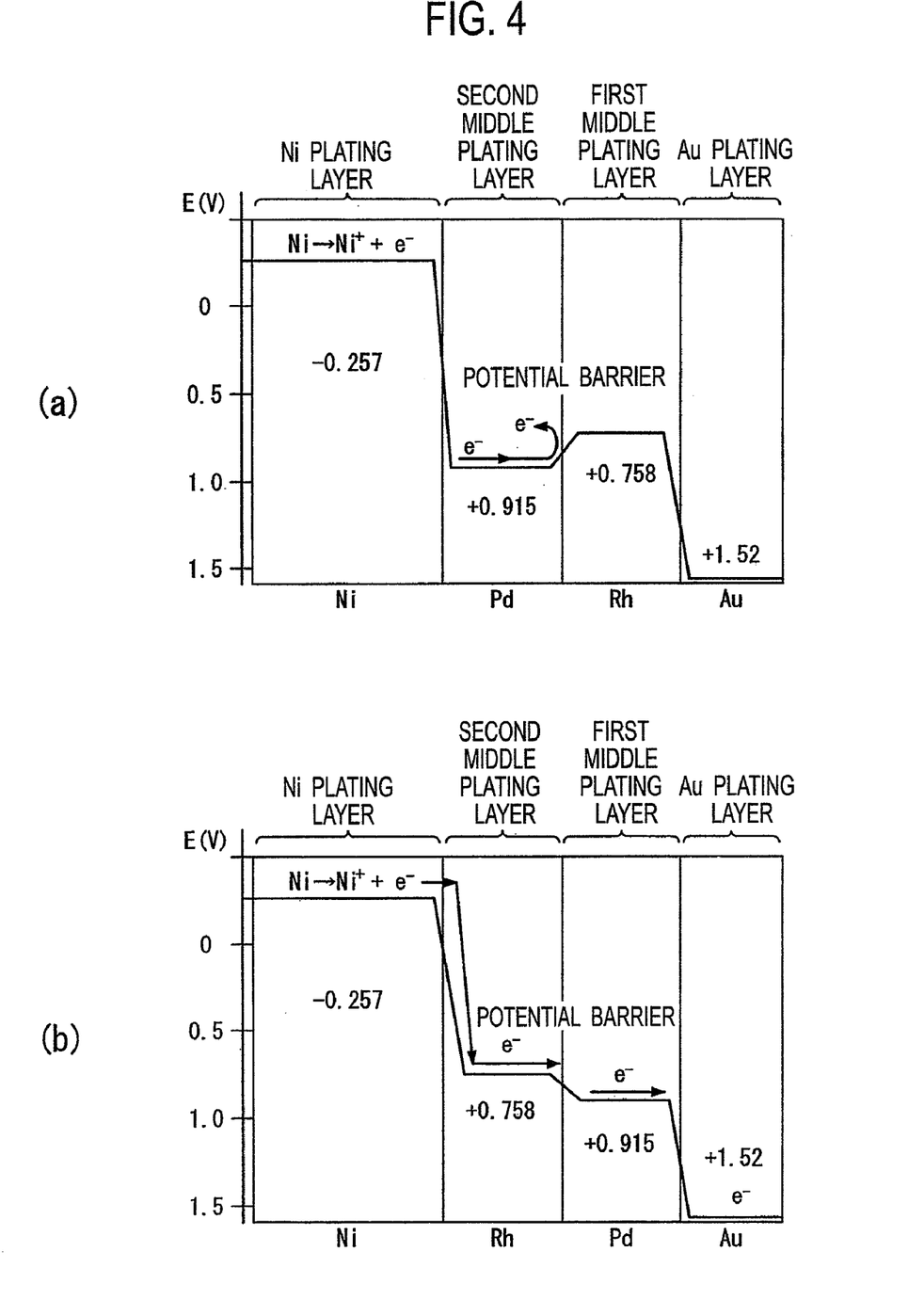
FIG. 4 is a schematic view conceptually showing a standard electrode potential of plating layers.

FIG. 4(*b*) conceptually shows the standard electrode potentials (E(V)) of the plating layers formed in the order of the Ni plating layer 6, the second middle plating layer 9 composed of Rh, the first middle plating layer 8 composed of Pd and the Au plating layer 7 in Comparative Example 4. In this example, the standard electrode potentials of metal in each plating layer are decreased in the order of the Ni plating layer 6, the second middle plating layer composed of Rh, the first middle plating layer 8 composed of Pd and the Au plating layer. The standard electrode potential of Rh in the second middle plating layer 9 is +0.758 V, and the standard electrode potential of Pd in the first middle plating layer 8 is +0.915 V. The potential barrier blocking the electrons from moving is not provided between the second middle plating layer 9 and the first middle plating layer 8. Therefore, the electrons (e$^-$) emitted at corrosion of Ni in the Ni plating layer 6 shift to the Au plating layer 7 and are thus easily emitted due to the reduction reaction. As a result, a corrosion reaction of Ni is promoted and corroded Ni is eluted. Accordingly, rust is caused as described above.

Meanwhile, FIG. 4(*a*) conceptually shows the standard electrode potentials (E(V)) of the plating layers formed in the order of the Ni plating layer 6, the second middle plating layer 9 composed of Pd, the first middle plating layer 8 composed of Rh and the Au plating layer 7 in Example 2. In this example, the standard electrode potential of Pd in the second middle plating layer 9 is +0.915 V, and the standard electrode potential of Rh in the first middle plating layer 8 is +0.758 V. The potential barrier blocking the electrons from moving is provided between the second middle plating layer 9 and the first middle plating layer 8. Therefore, it is possible to prevent the electrons (e$^-$) emitted at corrosion of Ni in the Ni plating layer 6 from shifting to the Au plating layer 7 and being emitted due to the reduction reaction. Thus, the promotion of the Ni corrosion reaction is inhibited, so as to prevent rust from being caused as described above.

Example 4

The insulating substrate 1 was molded by use of a molding material "K1400" manufactured by Kuraray Co., Ltd., in which white-colored polyphthalamide was used as a base resin. In addition, laser patterning was performed using a THG-YAG laser with a laser wavelength of 355 nm and a laser output of 0.35 W. Then, similar operations to those of Example 1 were repeated except that the Au plating layer 7 was formed on the Ni plating layer without plating to form the first middle plating layer 8 and the second middle plating layer 9, thereby obtaining the circuit board.

Example 5

The insulating substrate 1 was molded by use of a molding material "K1400" manufactured by Kuraray Co., Ltd., in which white-colored polyphthalamide was used as a base resin. In addition, laser patterning was performed using an SHG-YAG laser with a laser wavelength of 533 nm and a laser output of 0.45 W. Then, similar operations to those of Example 1 were repeated except that the Au plating layer 7 was formed on the Ni plating layer without plating to form the first middle plating layer 8 and the second middle plating layer 9, thereby obtaining the circuit board.

Example 6

The insulating substrate 1 was molded by use of a molding material "N1000A" manufactured by Kuraray Co., Ltd., in which natural-colored (inherent resin color with translucent white) polyphthalamide free from pigment was used as a base resin. In addition, laser patterning was performed using an SHG-YAG laser with a laser wavelength of 533 nm and a laser output of 0.45 W. Then, similar operations to those of Example 1 were repeated except that the Au plating layer 7 was formed on the Ni plating layer without plating to form the first middle plating layer 8 and the second middle plating layer 9, thereby obtaining the circuit board.

Example 7

The insulating substrate 1 was molded by use of a molding material "BT1500" manufactured by Kuraray Co., Ltd., in which black-colored polyphthalamide was used as a base resin. In addition, laser patterning was performed using a SHG-YAG laser with a laser wavelength of 533 nm and a laser output of 0.45 W. Then, similar operations to those of Example 1 were repeated except that the Au plating layer 7 was formed on the Ni plating layer without plating to form the first middle plating layer 8 and the second middle plating layer 9, thereby obtaining the circuit board.

Comparative Example 6

The insulating substrate 1 was molded by use of a molding material "BT1500" manufactured by Kuraray Co., Ltd., in which black-colored polyphthalamide was used as a base resin. In addition, laser patterning was performed using a THG-YAG laser with a laser wavelength of 355 nm and a laser output of 0.35 W. Then, similar operations to those of Example 1 were repeated except that the Au plating layer 7 was formed on the Ni plating layer without plating to form the first middle plating layer 8 and the second middle plating layer 9, thereby obtaining the circuit board.

Comparative Example 7

The insulating substrate 1 was molded by use of a molding material "BT1500" manufactured by Kuraray Co., Ltd., in which black-colored polyphthalamide was used as a base resin. In addition, laser patterning was performed using a THG-YAG laser with a laser wavelength of 355 nm and a laser output of 0.56 W. Then, similar operations to those of Example 1 were repeated except that the Au plating layer 7 was formed on the Ni plating layer without plating to form the first middle plating layer 8 and the second middle plating layer 9, thereby obtaining the circuit board.

The above-described Examples 4 to 7 and Comparative Examples 6 to 7 were subjected to plasma treatment. Then, surface roughness Rz (Rz1) of the respective insulating substrates 1 before forming the metal thin film 2 by copper sputtering was measured. Similarly, surface roughness Rz (Rz2) of the respective insulating substrates 1 after removing the metal thin film 2 by laser patterning was measured. Rz2/Rz1 was subsequently calculated. The results are shown in Table 4.

The circuit boards obtained in the above-described Examples 4 to 6 and Comparative Examples 6 to 8 were subjected to a galvanic corrosion test by use of artificial perspiration in a similar manner as descried above. The results of a virtual observation for the circuits 3 are shown in Table 4.

TABLE 4

|  | Example | | | | Comparative Example | |
| --- | --- | --- | --- | --- | --- | --- |
|  | 4 | 5 | 6 | 7 | 6 | 7 |
| Color of Insulating Substrate | White | White | Natural | Black | Black | Black |
| Laser Wavelength (nm) | 355 (THG) | 533 (SHG) | 533 (SHG) | 533 (SHG) | 355 (THG) | 355 (THG) |
| Laser Output (W) | 0.35 | 0.45 | 0.45 | 0.45 | 0.35 | 0.56 |
| Rz2/Rz1 | 1.4 | 0.8 | 0.5 | 1.6 | 1.9 | 11.4 |
| Rz2 (mm) | 6.27 | 5.36 | 0.26 | 0.66 | 1.92 | 5.81 |
| Rz1 (mm) | 4.63 | 6.86 | 0.53 | 0.42 | 1.0 | 0.51 |
| Corrosion Resistance | ○ | ○ | ○ | ○ | X | X |

As shown in Table 4, corrosion was caused in the circuits 3 in each comparative example in which Rz2/Rz1 was 1.9 or more. On the other hand, corrosion was not caused in the circuits 3 in each example in which Rz2/Rz1 was less than 1.9. It is recognized that durability of the circuits 3 in each example is improved.

The entire content of Japanese Patent Application No. 2007-287604 filed on Nov. 5, 2007 is herein incorporated by reference.

The description has been made above of the embodiments to which the invention made by the inventors is applied; however, the present invention is not limited by the description and the drawings, which are in accordance with the embodiments and form a part of the disclosure of the present invention. Specifically, it is additionally noted here that it is a matter of course that other embodiments, examples, application technologies, and the like, which are made by those skilled in the art, and the like based on the above-described embodiments, are entirely incorporated in the scope of the present invention.

The invention claimed is:

1. A circuit board comprising:
   an insulating substrate; and
   a circuit formed on the insulating substrate,
   wherein the circuit comprises:
   a undercoat layer with a circuit pattern formed by irradiating a metal thin film covering a surface of the insulating substrate with a laser along an outer shape of the circuit so as to partly remove the metal thin film along the outer shape of the circuit;
   a Cu plating layer, a Ni plating layer and a Au plating layer formed by metal plating and sequentially provided on a surface of the undercoat layer; and
   a first middle plating layer and a second middle plating layer provided between the Ni plating layer and the Au plating layer, wherein the first middle plating layer includes metal with a less noble standard electrode potential with respect to Au and is in contact with the Au plating layer, and wherein the second middle plating layer includes metal with a noble standard electrode potential with respect to the metal in the first middle plating layer and is in contact with the first middle plating layer,
   wherein the first middle plating layer is composed of Rh.

2. The circuit board according to claim 1,
   wherein the second middle plating layer is composed of any one of Pd—Ni and Pd.

3. The circuit board according to claim 1,
   wherein the insulating substrate is formed by molding a resin composition composed of polyphthalamide, and wherein a surface roughness Rz of the insulating substrate of a portion in which the metal thin film is removed by irradiating with the laser along the outer shape of the circuit is less than 1.9 times rougher than the surface roughness Rz of the insulating substrate before irradiating with the laser.

4. The circuit board according to claim 3, wherein the Au plating layer is subjected to sealing treatment.

5. The circuit board according to claim 3, wherein the Au plating layer is formed by pulse plating.

6. The circuit board according to claim 3, wherein the undercoat layer is formed by irradiating with the laser along the outer shape of the circuit at an even energy density.

7. The circuit board according to claim 3, wherein at least an interface of a side surface of the circuit and the surface of the insulating substrate is covered with a resin layer.

8. The circuit board according to claim 1, wherein the Au plating layer is subjected to sealing treatment.

9. The circuit board according to claim 1, wherein the Au plating layer is formed by pulse plating.

10. The circuit board according to claim 1, wherein the undercoat layer is formed by irradiating with the laser along the outer shape of the circuit at an even energy density.

11. The circuit board according to claim 1, wherein at least an interface of a side surface of the circuit and the surface of the insulating substrate is covered with a resin layer.

12. A method of manufacturing the circuit board according to claim 1, comprising:
- forming a undercoat layer with a circuit pattern by irradiating a metal thin film covering a surface of an insulating substrate with a laser along an outer shape of a circuit so as to remove the metal thin film along the outer shape of the circuit; and
- sequentially providing a Cu plating layer, a Ni plating layer, a second middle plating layer, a first middle plating layer and a Au plating layer on a surface of the undercoat layer by metal plating so as to form the circuit,
- wherein the first middle plating layer is formed by use of metal with a less noble standard electrode potential with respect to Au, and is in contact with the Au plating layer, and
- wherein the second middle plating layer is formed by use of metal with a noble standard electrode potential with respect to the metal in the first middle plating layer, and is in contact with the first middle plating layer.

13. A method of manufacturing the circuit board according to claim 3, comprising:
- forming a undercoat layer with a circuit pattern by irradiating a metal thin film covering a surface of an insulating substrate with a laser along an outer shape of a circuit so as to remove the metal thin film along the outer shape of the circuit; and
- sequentially providing a Cu plating layer, a Ni plating layer and a Au plating layer on a surface of the undercoat layer by metal plating so as to form the circuit,
- wherein the irradiation with the laser is performed by controlling an irradiation condition so that a surface roughness Rz of the insulating substrate of a portion in which the metal thin film is removed by irradiating with the laser is less than 1.9 times rougher than the surface roughness Rz of the insulating substrate before irradiating with the laser.

* * * * *